United States Patent
Kohama et al.

(10) Patent No.: US 10,261,282 B2
(45) Date of Patent: Apr. 16, 2019

(54) IMAGING ELEMENT MOUNTING SUBSTRATE, IMAGING DEVICE AND IMAGING MODULE

(71) Applicant: KYOCERA Corporation, Kyoto-shi, Kyoto (JP)

(72) Inventors: Kenichi Kohama, Satsumasendai (JP); Kanae Horiuchi, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/714,199

(22) Filed: Sep. 25, 2017

(65) Prior Publication Data

US 2018/0088296 A1 Mar. 29, 2018

(30) Foreign Application Priority Data

Sep. 29, 2016 (JP) ................................ 2016-191532

(51) Int. Cl.
| | |
|---|---|
| *H04N 5/372* | (2011.01) |
| *H04N 5/225* | (2006.01) |
| *G02B 7/02* | (2006.01) |
| *H01L 27/146* | (2006.01) |

(52) U.S. Cl.
CPC ............. *G02B 7/02* (2013.01); *G02B 7/021* (2013.01); *H01L 27/14625* (2013.01); *H04N 5/2253* (2013.01); *H04N 5/2254* (2013.01); *H04N 5/2258* (2013.01); *H04N 5/372* (2013.01)

(58) Field of Classification Search
CPC ........ G02B 7/02; G02B 7/021; H04N 5/2258; H04N 5/372; H04N 5/2254; H04N 5/2253; H01L 27/14625
See application file for complete search history.

(56) References Cited

U.S. PATENT DOCUMENTS

| | | | | |
|---|---|---|---|---|
| 7,555,211 | B2 * | 6/2009 | Go ..................... | G03B 7/09908 348/340 |
| 8,605,210 | B2 * | 12/2013 | Fabre .................. | H04N 5/2257 348/373 |
| 9,088,705 | B1 * | 7/2015 | Tam ..................... | H04N 5/2253 |
| 2004/0027477 | A1 * | 2/2004 | Tamura ............... | H04N 5/2253 348/340 |

(Continued)

FOREIGN PATENT DOCUMENTS

JP 2009-302102 A 12/2009

*Primary Examiner* — Hung H Lam
(74) *Attorney, Agent, or Firm* — Volpe and Koenig, P.C.

(57) ABSTRACT

An imaging element mounting substrate may include an insulating substrate and a metal substrate. The insulating substrate may include a first mounting region for mounting an imaging element on a top surface, and a second mounting region located a distance away from the first mounting region for mounting one or more electronic components. The insulating substrate may include a fixed region for securing a lens housing surrounding the first mounting region. A metal substrate may be bonded to a bottom surface of the insulating substrate. A third mounting region located between the first mounting region and the second mounting region in the fixed region of the insulating substrate may be positioned with respect to the center of the insulating substrate in a plan view. The metal substrate may be located to overlap with the third mounting region and bestride the first mounting region and the second mounting region.

10 Claims, 15 Drawing Sheets

(56) References Cited

U.S. PATENT DOCUMENTS

| | | | | |
|---|---|---|---|---|
| 2005/0001905 A1* | 1/2005 | Shinomiya | ............ | H04N 5/2251 348/207.99 |
| 2005/0285973 A1* | 12/2005 | Singh | ................ | H01L 27/14618 348/374 |
| 2011/0150462 A1* | 6/2011 | Chiu | ........................ | G03B 3/10 396/542 |

* cited by examiner

IMAGING ELEMENT MOUNTING SUBSTRATE, IMAGING DEVICE AND IMAGING MODULE

FIELD

The present invention relates to an imaging element mounting substrate, an imaging device, and an imaging module on which imaging elements such as a charge coupled devices (CCD) or complementary metal oxide semiconductors (CMOS) may be mounted among other electronic elements.

BACKGROUND ART

Conventionally, imaging element mounting substrates having insulating substrates made of an insulating layer are known. In addition, an imaging device is also known that such imaging element mounting substrates may include imaging elements mounted thereon (see JP 2009-302102 A).

According to the technique disclosed in JP 2009-302102 A, as the demand for multi-functionality of imaging element mounting substrates has increased in recent years, semiconductor elements and other electronic components other than imaging elements, such as sensors, are mounted on imaging element mounting substrates. As a result, as compared to configurations where only imaging elements are mounted on imaging element mounting substrates, the regions used for mounting components other than imaging elements have increased in size, and there is a tendency for imaging element mounting regions to be provided in off-center locations of the imaging element mounting substrate. Further, in the case of such imaging devices, a fixed region for securing a lens housing around the imaging elements may be provided.

SUMMARY OF INVENTION

An imaging element mounting substrate according to one embodiment of the present invention includes an insulating substrate and a metal substrate. The insulating substrate includes a first mounting region where an imaging element is mounted on a top surface thereof, and a second mounting region on which electronic components, provided a distance away from the first mounting region, is mounted. In addition, the insulating substrate includes a fixed region for securing a lens housing so as to surround the first mounting region. A metal substrate may be bonded to a bottom surface of the insulating substrate. The fixed region positioned between the first mounting region and the second mounting region of the insulating substrate is located off-center with respect to the center of the insulating substrate 2 in a plan view. The metal substrate is located to overlap with the fixed region located between the first and second mounting regions and bestride the first mounting region and the second mounting region.

An imaging element mounting substrate according to one embodiment of the present invention includes an insulating substrate and a metal substrate. The metal substrate includes a first mounting region where an imaging element is mounted on a top surface thereof. The insulating substrate includes a second mounting region and a fixed region. The insulating substrate is bonded to a top surface of the metal substrate. The second mounting region includes a top surface on which electronic components, located a distance away from the first mounting region in a plan view, is mounted. The fixed region is configured to secure a lens housing so as to surround the first mounting region. The third mounting region located between the first mounting region and the second mounting region in the fixed region is positioned off-center with respect to the center of the insulating substrate in a plan view. The metal substrate may be positioned so as to overlap with the third mounting region. The metal substrate straddles (bestrides) the first mounting region and the second mounting region.

An imaging device according to one embodiment of the present invention includes an imaging element, an imaging element mounting substrate, and a lid. The imaging device is mounted in the first mounting region. The lid covers the imaging element and be bonded to imaging element mounting substrate.

An imaging module according to one embodiment of the present invention includes an imaging device, an electronic component, and a lens housing. Electronic components are mounted in the second mounting region. The lens housing may be secured in the fixed region.

DESCRIPTION OF EMBODIMENTS

Figure 1A:
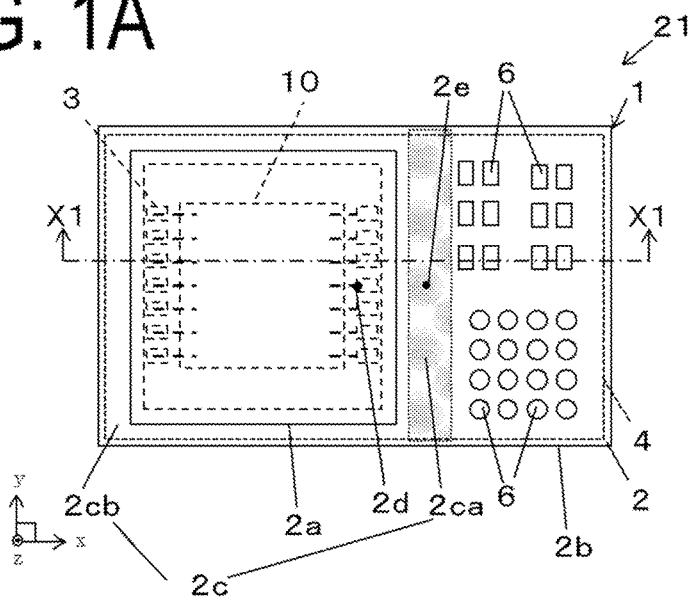
FIG. 1A is a top view illustrating the outer appearance of an imaging element mounting substrate and an imaging device according to one embodiment of the present invention.

Configuration of the Imaging Element Mounting Substrate and Imaging Device

Several exemplary embodiments of the present invention will be described hereinafter with reference to the drawings. In the following description, a configuration in which an imaging element is mounted on a first mounting region of the imaging element mounting substrate and a lid is bonded to a top surface of the imaging element mounting substrate will be referred to as an imaging device. Also, a configuration including a lens housing and electronic components provided on a top surface of the imaging element mounting substrate will be referred to as an imaging module. With respect to the imaging element mounting substrate, imaging device and imaging module, any direction may be defined as upward or downward, but for the sake of simplicity, an Cartesian coordinate system XYZ will be used herein, with a positive side in the Z direction defined as upward and the terms "top surface" and "bottom surface" being used.

First Embodiment

An imaging device 21 and an imaging element mounting substrate 1 according to an embodiment of the present invention will be described with reference to FIGS. 1A to 5B. FIGS. 2A and 2B, FIGS. 3A and 3B, and FIGS. 5A and 5B illustrate the imaging module 31. In the examples shown in FIGS. 1A to 3B, 5A, and 5B, the third mounting region 2ca is indicated by dots and dotted lines in a top view.

The imaging element mounting substrate 1 may include an insulating substrate 2 and a metal substrate 4. The insulating substrate 2 may include a first mounting region 2a where imaging elements 10 may be mounted on a top surface thereof, and a second mounting region 2b on which electronic components 11, provided a distance away from the first mounting region 2a, may be mounted. Also, the insulating substrate 2 may include a fixed region 2c for securing a lens housing 19 provided so as to surround the first mounting region 2a. A metal substrate 4 may be bonded to the bottom surface of the insulating substrate 2. The third mounting region 2c located between the first mounting region 2a and the second mounting region 2b in the fixed region 2c of the insulating substrate 2 may be positioned eccentrically (off-center) with respect to the center of the insulating substrate 2 in a plan view. The metal substrate 4 may be positioned so as to overlap with the third mounting region 2c and bestride the first mounting region 2a and the second mounting region 2b. Also, a first pad 3, a second pad 6, and a third pad 9 may be included as external connection electrodes, which will be further described later.

Figure 6A:
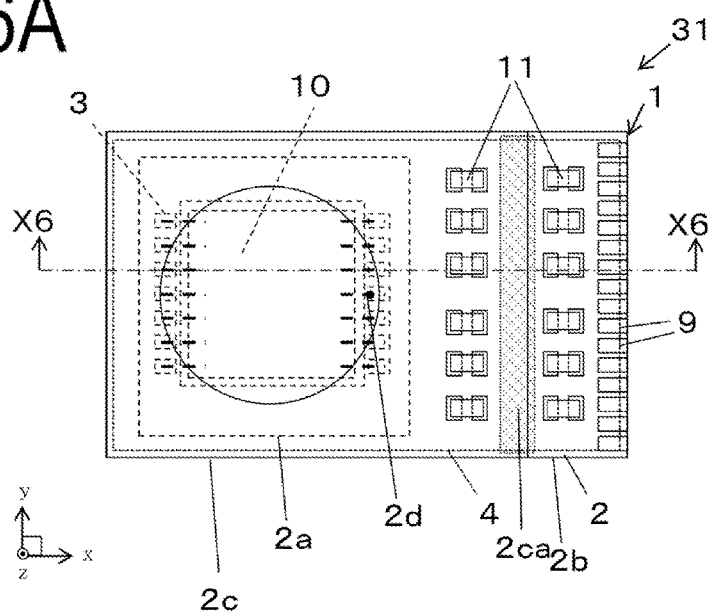
FIG. 6A is a top view illustrating the outer appearance of an imaging module according to an aspect of another embodiment of the present invention.
Figure 6B:
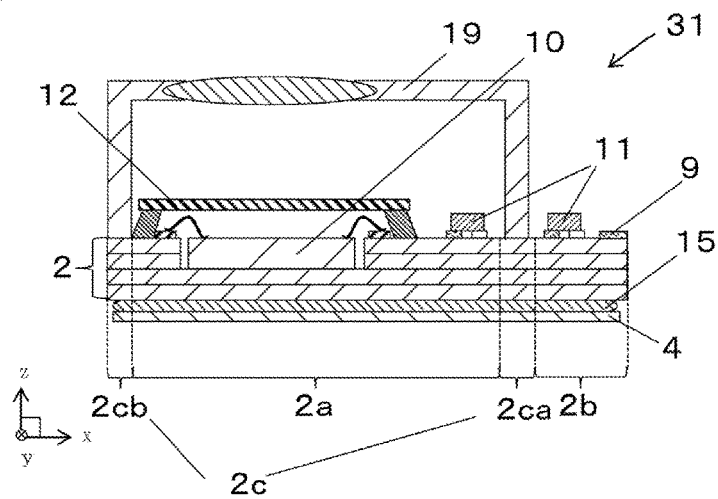
FIG. 6B is a vertical cross-sectional view corresponding to the line X6-X6 in FIG. 6A.

The imaging element mounting substrate 1 may include an insulating substrate 2. The insulating substrate 2 may comprise insulating layers, and may include the first pad 3 electrically connected to the imaging elements 10 on the top surface of the insulating substrate 2, as will be further described later. Further, as illustrated in FIGS. 6A and 6B with respect to another embodiment that will be described later, a plurality of third pads 9 connected to external circuits or the metal substrate 4 may be provided on the bottom surface, top surface, or side surface of the insulating substrate 2. As a material of the insulating layers forming the insulating substrate 2, an electrically insulating ceramic, resin or the like may comprise, for example.

Examples of the electrically insulating ceramic used as the material of the insulating layers forming the insulating substrate 2 may include an aluminum oxide-based sintered body, a mullite-based sintered body, a silicon carbide sintered body, an aluminum nitride-based sintered body, a silicon nitride-based sintered body, a glass ceramic sintered body, or the like. Examples of the resin used as the material of the insulating layers forming the insulating substrate 2 may include an epoxy resin, a polyimide resin, an acrylic resin, a phenol resin, a fluorine-based resin, and the like. The fluorine-based resin may include a polyester resin or an ethylene tetrafluoride resin, for example.

Figure 1B:
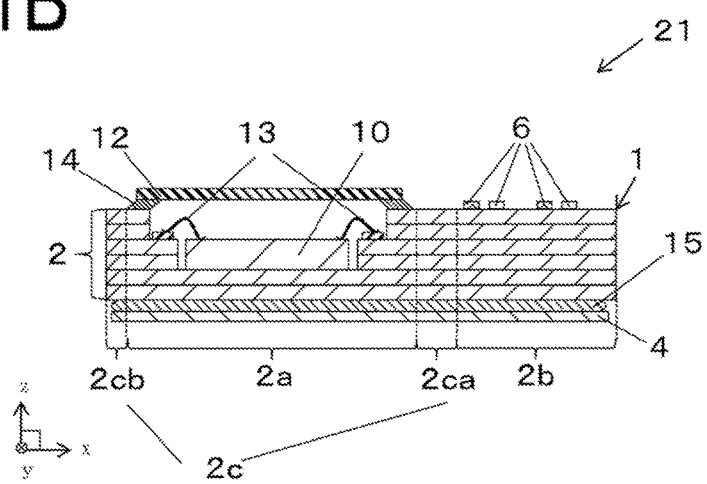
FIG. 1B is a vertical cross-sectional view corresponding to the line X1-X1 of FIG. 1A.

In the insulating layers forming the insulating substrate 2, a plurality of insulating layers made of the above-described materials may be stacked vertically. As illustrated in FIGS. 1A and 1B, the insulating layers forming the insulating substrate 2 may be formed of six insulating layers, a single layer, two to five layers, or seven or more layers. When the insulating substrate 2 has six or more insulating layers, it may be possible to obtain a sufficient thickness and wiring area in the insulating substrate 2. In this way, it becomes possible to improve the electrical characteristics of the insulating substrate 2 and to mitigate warping, cracking, or breaking of the insulating substrate 2. Also, when the insulating substrate 2 comprises five or less insulating layers, the insulating substrate 2 may be made thinner. Further, as in the example illustrated in FIGS. 1A and 1B, the insulating substrate 2 may include a recessed portion in which imaging elements 10 may be arranged, the size of the opening of each of the insulating layers that forms the recessed portion may be modified, a step portion may be formed on the top surface, and a plurality of first pads 3 may be provided on the step portion.

As examples, the size of one side of the insulating substrate 2 may be about from 0.3 mm to 10 cm, and the insulating substrate 2 may be a square, a rectangle or the like in a plan view. Also, for example, the thickness of the insulating substrate 2 may be 0.2 mm or greater.

Further, a third pad 9 may be provided on the top surface, a side surface, or the bottom surface of the insulating substrate 2. The third pad 9 may be configured to electrically connect the insulating substrate 2 and an external circuit board, or electrically connect the imaging device 21 and an external circuit board. Further, on the top surface of the insulating substrate 2, there may be a second pad 6 on which an electronic component 11 is mounted, as will be described later.

Inside the insulating substrate 2, internal wirings formed between the insulating layers and through conductors for vertically connecting the internal wires may be provided. These internal wirings and through conductors may be exposed on the surface of the insulating substrate 2. The first pad 3, second pad 6, or third pad 9 may each be electrically connected by the internal wiring or the through conductors.

When the insulating substrate 2 is formed of electrically insulating ceramic, the first pad 3, the second pad 6, the third pad 9, the internal wiring and the through conductors may comprise one of tungsten (W), molybdenum (Mo), manganese (Mn), silver (Ag), and copper (Cu), or from an alloy a containing at least one type of metal material selected from among these. When the insulating substrate 2 is formed of resin, the first pad 3, the second pad 6, the third pad 9, the internal wiring and the through conductors may be formed of one of copper (Cu), gold (Au), aluminum (Al), nickel (Ni), molybdenum (Mo), and titanium (Ti), or comprise an alloy containing at least one type of metal material selected from among these.

A plating layer may be positioned on the exposed surfaces of the first pad 3, the second pad 6, the third pad 9, the internal wiring and the through conductors. According to such a configuration, the effects of oxidation can be reduced by protecting the exposed surfaces of the first pad 3, the second pad 6, the third pad 9, the internal wiring, and the through conductors. In addition, according to this configuration, the first pad 3 and the imaging elements 10 can be favorably electrically connected via a bonding member 13 such as wire bonding. As the plating layer, an Ni plating layer with a thickness of 0.5 to 10 μm is deposited. In addition, a gold (Au) plating layer with a thickness of 0.5 to 3 μm may be deposited on top of the Ni plating layer.

The insulating substrate 2 of the imaging element mounting substrate 1 may include a first mounting region 2a where imaging elements 10 may be mounted on a top surface thereof, and a second mounting region 2b on which electronic components 11, provided a distance away from the first mounting region 2a, may be mounted. Also, the insulating substrate 2 may include a fixed region 2c for securing a lens housing 19 provided so as to surround the first mounting region 2a. Here, the first mounting region 2a may be a region where at least one or more imaging elements 10 as well as components other than imaging elements 10 may be mounted. The second mounting region 2b may be a region where electronic components 11 may be mounted. Note that the number, size, type, and other aspects of the electronic components 11 are not limited herein.

Figure 5A:
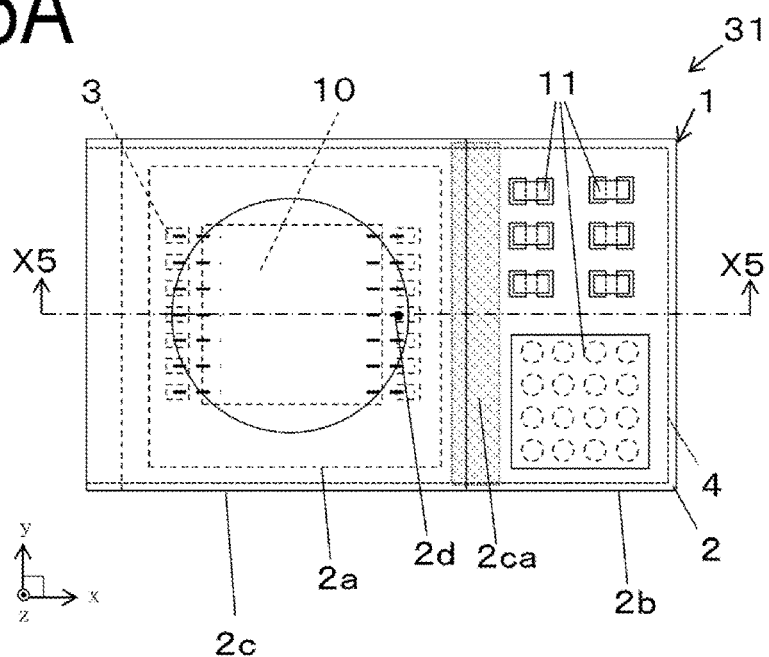
FIG. 5A is a top view illustrating the outer appearance of an imaging module according to another aspect of one embodiment of the present invention.
Figure 5B:
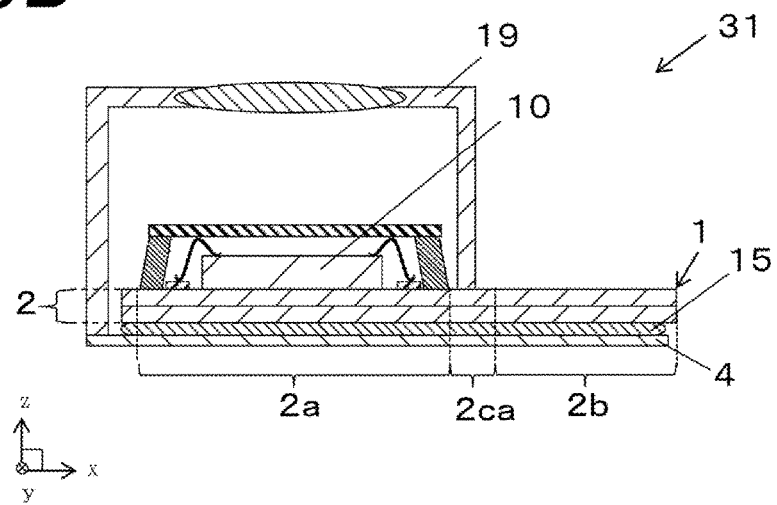
FIG. 5B is a vertical cross-sectional view corresponding to the line X5-X5 in FIG. 5A.

The fixed region 2c may be positioned so as to surround the first mounting region 2a, and may be a region to which the lens housing 19 may be secured. The fixed area 2c may be at least as large as the size (width) of a leg portion of the lens housing 19, or larger. A pad for electrically connecting the lens housing 19 and the insulating substrate 2 may be provided on the surface of the fixed region 2c. Note that, when the fixed region 2c is rectangular in shape, it may be sufficient for at least one side or a part of one side of the fixing region 2c to be provided on the insulating substrate 2, and as illustrated in FIGS. 5A and 5B and described later, there may be a part that is not provided on the insulating substrate 2.

The fixed region 2c may be a region in which the lens housing 19 may be secured. Also, with respect to the imaging element mounting substrate 1, the fixed region 2c may refer to a region between the first mounting region 2a and the second mounting region 2b comprising a first pad 3 for mounting imaging devices 10 and a second pad 6 for mounting electronic components 11. Further, with respect to the imaging device 21, the third mounting region 2c may be a region from the region where the lid 12 is secured to the second pad 6 on which the electronics components 11 are mounted in a plan view. With respect to the imaging module 31, the fixed region 2c may be an area in which the lens housing 19 is secured.

A metal substrate 4 may be bonded to the bottom surface of the insulating substrate 2 of the imaging element mounting substrate 1. As an example, materials having high thermal conductivities may comprise as the material constituting the metal substrate 4. By using materials having a high thermal conductivity, the heat generated when using the imaging element 10 or heat applied when the insulating substrate 2 and the metal substrate 4 are bonded by the bonding material 15 can be diffused throughout the entire metal substrate 4.

Also, as the material for the metal substrate 4, a metal material may be used, including, for example, stainless steel (SUS: Steel Use Stainless), an iron-nickel-cobalt alloy (Fe—Ni—CO), an iron-nickel alloy (Fe—Ni), copper (Cu), a copper alloy, or the like. Further, for example, when the insulating substrate 2 is an aluminum oxide-based sintered body having a coefficient of thermal expansion of approximately $5 \times 10^{-6}/°$ C. to $10 \times 10^{-6}/°$ C., stainless steel (SUS410 or SUS304 or the like in JIS) having a coefficient of thermal expansion of between approximately $10 \times 10^{-6}/°$ C. and $17 \times 10^{-6}/°$ C. may be used for the metal substrate 4.

In this case, as the thermal shrinkage difference and thermal expansion difference between the insulating substrate 2 and the metal substrate 4 are reduced, it is possible to decrease the stress applied between the insulating substrate 2 and the metal substrate 4. In this way, deformation of the insulating substrate 2 and the metal plate 4 can be reduced. As a result, the optical axis deviation of the lens housing 19 secured to the imaging elements 10 and the insulating substrate 2 can be suppressed, and image clarity can be maintained. Also, the occurrence of cracks or breakage of the insulating substrate 2 can be reduced.

In addition, when the metal substrate 4 comprises a metallic material, by using a nonmagnetic metal material, it is possible to reduce magnetization of the metal substrate 4 by the electronic components 11 or the imaging elements 10.

As an example, the size of one size of the metal substrate 4 may be about from 0.3 mm to 10 cm, and may be adjusted based on the size of the insulating substrate 2. Also, for example, the thickness of the metal substrate 4 may be 0.05 mm or greater.

The insulating substrate 2 and the metal substrate 4 may be joined by a bonding material 15. As the material constituting the bonding material 15, a thermosetting resin, a brazing material, or the like may comprise, for example. The thermosetting resin used as the material constituting the bonding material 15 may include, for example, a bisphenol A based liquid epoxy resin or the like. Also, the brazing material used as the material constituting the bonding material 15 may, for example, be solder, lead, or glass.

The bonding material 15 may be electrically conductive. The bonding material 15 with electrical conductivity includes, for example, silver epoxy, solder, anisotropic conductive resin (ACF) or anisotropic conductive film (ACP) or the like. As the bonding material 15 is electrically conductive, it becomes possible to electrically connect the insulating substrate 2 and the metal substrate 4. For example, by electrically connecting the insulating substrate 2 and the metal substrate 4 with the same potential as the ground electrode, the metal substrate 4 can serve as a shield to protect the imaging elements 10 from external noise.

With respect to the imaging element mounting substrate 1, the third mounting region 2ca of the insulating substrate 2 may be positioned off-center with respect to the center 2d of the insulating substrate 2 in a plan view. The metal substrate 4 may overlap with the third mounting region 2ca and bestride the first mounting region 2a and the second mounting region 2b. In particular, in a plan view, it may be desirable that the center 2e of the third mounting region 2ca of the insulating substrate 2 does not overlap with the center 2d of the insulating substrate 2; that is, it may be desirable for them to be spaced apart.

Herein, in a configuration where the insulating substrate 2 has a polygonal shape, the center 2d of the insulating substrate 2 may refer to the vicinity of points where diagonal lines from each corner intersect. Also, for example, in a configuration where the insulating substrate 2 is substantially circular, it may refer to the center point thereof. In particular, the third mounting region 2ca being located eccentrically with respect to the center 2d of the insulating substrate 2 in a plan view may refer to the center 2e of the third mounting region 2ca being located off-center with respect to the center 2d of the insulating substrate 2 on the top surface. For example, when the center 2e of the third mounting region 2ca is separated by a distance of 0.05 mm or greater from the center 2d of the insulating substrate 2, it may be considered that the fixed region 2c is eccentric with respect to the center 2d of the insulating substrate 2 in a plan view. Also, the fixed region 2c may preferably include 5% to 50% of the top surface of the insulating substrate 2. With this size, the bonding strength between the insulating substrate 2 and the lens housing 19 can be improved. Further, each mounting region can be sufficiently secured.

Note that, in the present embodiment, the insulating substrate may have a rectangular shape of, for example, 3 mm×5 mm in a plan view, and the first mounting region 2a may be 2.5 mm×2.5 mm. Also, the width of the fixed region 2c may, for example, be 0.5 mm. The center 2d of the insulating substrate 2 may be located 1.5 mm from the outer edge of the short-side direction of the insulating substrate 2, and 2.5 mm from the outer edge of the long-side direction. In contrast, as the center 2e of the third mounting region 2ca is separated by a distance of 3 mm or greater from the corresponding position of the outer edge of the insulating substrate 2, the center 2e is separated by 0.05 mm or greater. That is, in such a case, it can be said that the center 2e of the third mounting region 2ca is eccentric.

In the present embodiment, the metal substrate 4 of the imaging element mounting substrate 1 may be positioned so as to overlap with the third mounting region 2ca in a plan view, and may be located so as to bestride the first mounting region 2a and the second mounting region 2b. In this way, it becomes possible to reduce bending of the insulating substrate 2 resulting from the stress of the lens housing 19.

As in the example illustrated in FIGS. 1A and 1B, the insulating substrate 2 may have a recessed portion, and a bottom surface of the recessed portion may serve as the first mounting region 4a. In this way, it becomes possible to reduce the thickness of the imaging device 21. In addition, as the insulating substrate 2 comprises a recessed portion and the bottom surface of the recessed portion includes a portion of the first mounting region 4a, the distance between the imaging elements 10 mounted on the first mounting region and the metal substrate 4 can be reduced.

Figure 3A:
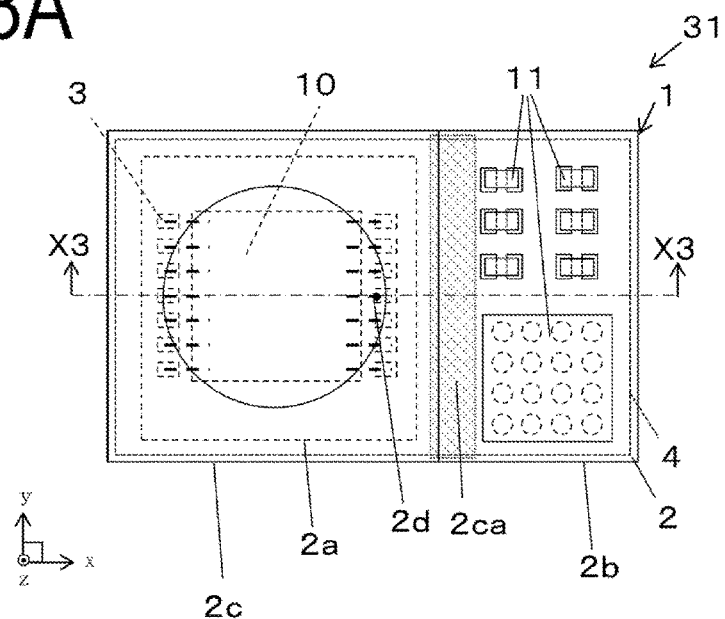
FIG. 3A is a top view illustrating the outer appearance of an imaging module according to another aspect of one embodiment of the present invention.
Figure 3B:
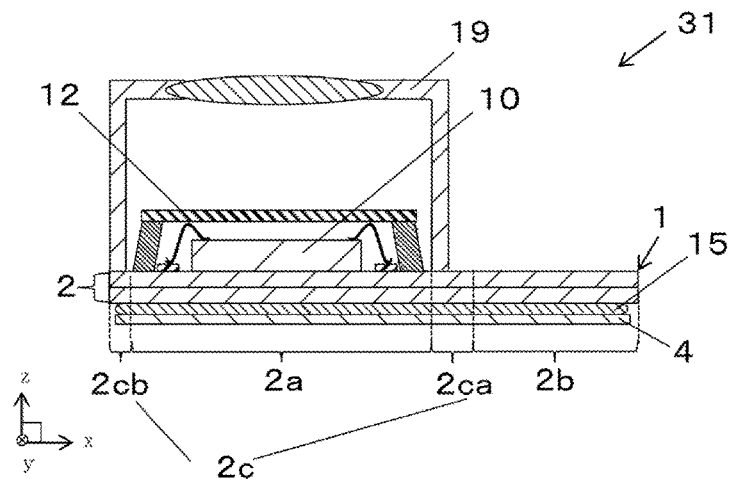
FIG. 3B is a vertical cross-sectional view corresponding to the line X3-X3 of FIG. 3A.

As in the example illustrated in FIGS. 3A and 3B, the insulating substrate 2 may have a flat plate shape. By making the insulating substrate 2 in the shape of a flat plate, it is possible to reduce the base point (the corners of the recessed portion and the like) where stress concentrates, so it is possible to reduce the occurrence of cracks or breakage.

The metal substrate 4 of the imaging element mounting substrate 1 may overlap with other fixed regions 2cb of the fixed region 2c other than the third mounting region 2ca. As the metal plate 4 overlaps with the other fixed regions 2cb in a plan view, it is possible to further reduce the bending of the insulating substrate 2 due to the stress from the lens housing 19.

The imaging element mounting substrate 1 may include a bonding material 15 comprising a resin material between the insulating substrate 2 and the metal substrate 4. Generally, as the bonding material 15 is made of a resin material, it tends to be softer than the brazing material made of a metal material. Therefore, even if a stress is applied to the insulating substrate 2 from the lens housing 19, the bonding material 15 comprising the resin material may alleviate the impact, such that it is possible to reduce the occurrence of cracks and breaks in the insulating substrate 2.

In addition, as the bonding material 15 made of the resin material tends to be relatively soft, even if undulation is conveyed from an external device to the imaging element mounting substrate 1, the imaging element mounting substrate 1 can follow accordingly. In this way, it may become possible to reduce the likelihood of separation between the metal substrate 4 and the insulating substrate 2. Therefore, as the metal substrate 4 and the insulating substrate 2 can follow movement, it is possible to maintain the reinforcing effect of the metal substrate 4, and undulation of the insulating substrate 2 can be reduced.

A ground layer (ground potential) may be also located on a bottom surface of the insulating substrate 2 of the imaging element mounting substrate 1. In this way, it may become possible to improve the electrical characteristics of the imaging element mounting substrate 1. In addition, in such a configuration, the ground layer provided on the bottom surface of the insulating substrate 2 and the metal substrate 4 may be connected by a bonding material 15 with electrical conductivity. This makes it possible to improve the electrical characteristics of the imaging element mounting substrate 1. Also, it may be possible to reduce noise with respect to the imaging element 10 in the imaging device 21. Note that in this configuration, the ground layer may cover the entire bottom surface of the insulating substrate 2, or may be provided partially on the surface in order to avoid a current loop. Also, the ground layer may be located within the insulating substrate 2 and be located so as to overlap with the first mounting region 2a in a plan view. In this way, it may become possible to improve the electrical characteristics of the imaging element mounting substrate 1 and reduce noise with respect to the imaging elements 10. In such a configuration, even if the layer has the same electrical potential as the power supply rather than the ground layer, it is possible to achieve the effect of improving the electrical characteristics of the imaging element mounting substrate 1.

A metalization layer may be provided on the top surface of the fixed region 2c of the imaging element mounting substrate 1. By positioning the metalization layer on the top surface of the fixed region 2c and covering the contours of the surface with the metalization layer to make it smooth, it is possible to reduce the occurrence of cracks or breakage of the imaging element mounting substrate 1.

In addition, as the metalization layer is located in the fixed region 2c, it is possible to position a gold (Au) plating on the surface of the metalization layer. Therefore, in comparison to configurations in which the wiring is configured using the internal wiring inside the insulating substrate 2, it is possible to lower the resistance value of the wiring. Also, by configuring the wiring on the surface of the insulating substrate 2, it may be possible to reduce the number of layers of the insulating layers of the insulating substrate 2, thereby decreasing its thickness.

Further, an insulating paste may be provided on the top surface of the fixed region 2c of the imaging element mounting substrate 1. Similar to the case of the metalization layer, by utilizing an insulating paste, the surface of the insulating substrate 2 may be covered with the insulating paste to smooth its surface, thereby reducing the occurrence of cracks and breakage of the imaging element mounting substrate 1.

Also, a metalization layer or an insulating paste may be provided within the insulating substrate 2 at a position overlapping with the fixed region 2c in a plan view. This makes it possible to reinforce the fixed region 2c where cracks or breaks are likely to occur in the metalization layer or the insulating paste. Therefore, the occurrence of cracks or breakage in the imaging element mounting substrate 1 can be reduced. Note that, in such a configuration, the metalization layer or the insulating paste may be one layer of the insulating substrate 2 arranged so as to encircle the fixed region 2c, or may be a plurality of layers encircling the fixed region 2c. Also, there may be a plurality of layers at the same position in a top view.

Figure 4A:
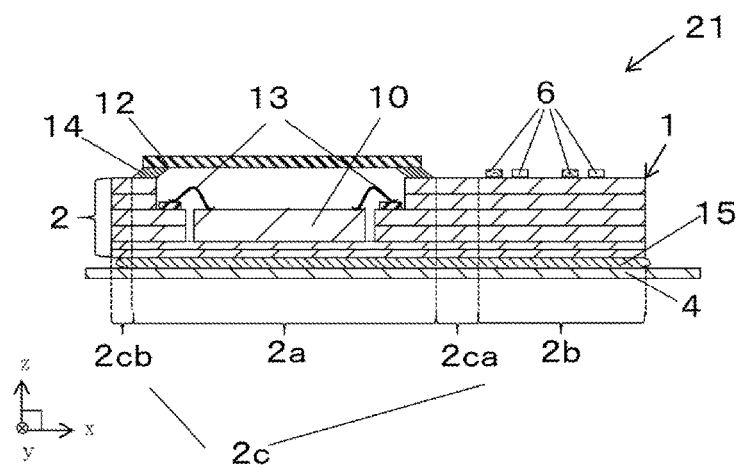
FIG. 4A is a vertical cross-sectional view of an imaging element mounting substrate according to another aspect of one embodiment of the present invention.
Figure 4B:
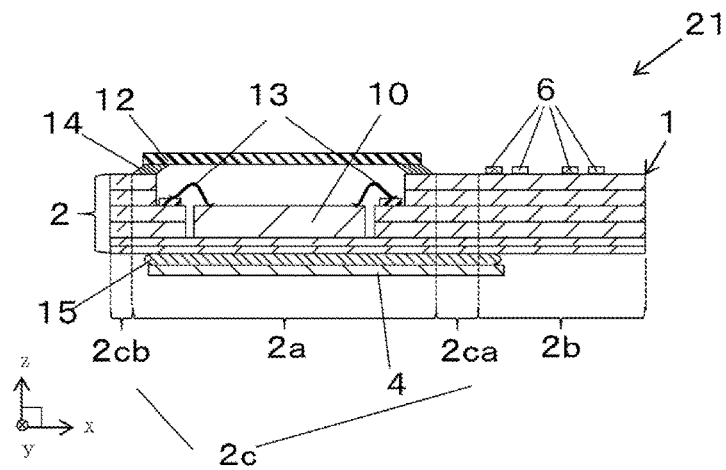
FIG. 4B is a vertical cross-sectional view of an imaging element mounting substrate according to another aspect of one embodiment of the present invention.

FIGS. 4A and 4B illustrate a cross-sectional view according to another aspect of the present embodiment. As illustrated in FIG. 4A, with respect to the imaging element mounting substrate 1, the outer edge of the metal substrate 4 may be located further outward than the outer edge of the insulating substrate 2 in a top view. Also, as in the example illustrated in FIG. 4B, the outer edge of the metal substrate 4 may be located inside the outer side of the insulating substrate 2 in a top view. As in the example illustrated in FIG. 4A, as the outer side of the metal substrate 4 is positioned further outward than the outer side of the insulating substrate 2 in a top view, it is possible to reduce the stress applied from the side surface of the insulating substrate 2. Therefore, it is possible to reduce the occurrence of cracks or the like due to stress from the side surface. As in the example illustrated in FIG. 4B, as the outer side of the metal substrate 4 is located inside the outer side of the insulating substrate 2 in a top view, the imaging element mounting substrate 1 can be decreased in size. Note that in such a configuration, as the metal substrate 4 overlaps with the fixed region 2c sandwiched between the first mounting region 2a and the second mounting region 2b in a top view, cracks or breakage may be prevented, but it need not overlap with other fixed regions 2cb.

Configuration of the Imaging Device

FIGS. 1A and 1B and FIGS. 4A and 4B illustrate examples of the imaging device 21. The imaging device 21 may include an imaging element mounting substrate 1, an imaging element 10 mounted on a first mounting region 2a of the imaging element mounting substrate 1, and a lid 12 bonded to the imaging element mounting substrate 1 and covering the imaging element 10.

The imaging device 21 may include an imaging element mounting substrate 1 and an imaging element 10 mounted on a first mounting region 2a of the imaging element mounting substrate 1. The imaging element 10 may, for example, be a CCD imaging element or a CMOS imaging element.

The imaging device 21 may include a lid 12 bonded to the imaging element mounting substrate 1 and covering the imaging element 10. Herein, the imaging element mounting substrate 1 may support the lid 12 on the top surface, and include a frame body surrounding the imaging element 10. Configurations without the frame body are also possible. The frame body may be made from the same material as the insulating substrate 2. Configurations in which the frame body is made of another material are also possible.

As an example of a configuration in which the frame body and the insulating substrate 2 comprise the same material, there are cases where the frame body and the insulating substrate 2 are both comprising, for example, an electrically insulating ceramic. In such a configuration, as the frame body and the insulating substrate 2 comprise through sintering, the bonding strength may be substantially high. Further, the frame body may be integrally formed with the insulating substrate 2. Accordingly, as in the example illustrated in FIGS. 1A and 1B, it may be possible to provide one or more first pads 3 on the frame body and electrically connect them to the insulating substrate 2.

Also, as an example in which the frame body and the insulating substrate 2 are made from different materials, for example, the frame body may be made of the same material as the adhesive material 14 joining the lid 12 to the insulating substrate 2. In such a configuration, by thickening the adhesive material 14 it may be possible to combine the effect of adhesion and the effect serving as the frame body (the member for supporting the lid 12). Note that, in this case, the adhesive material 14 may include, for example, a thermosetting resin, a low-melting point glass, or a brazing material. In addition, in some configurations, the frame body and the lid 12 may be made of the same material, and in such cases, the frame body and the lid 12 may be configured as one unit.

The lid 12 may, for example, be in the shape of a flat plate. Also, when the image elements 10 include image elements such as CMOS, CCD, or the like, a material having high transparency such as a glass material may be utilized as the lid 12.

As the imaging device 21 includes the imaging element mounting substrate 1 as illustrated in FIGS. 1A and 1B, and FIGS. 4A and 4B, even when external stress is applied to the imaging device 21, the occurrence of cracks or breakage of the imaging elements 10 can be reduced.

Herein, the imaging element 10 and the insulating substrate 2 may be adhered using an adhesive member having a relatively high elasticity, such as resin. By utilizing a bonding member having a relatively high elasticity, it becomes possible to absorb external stress applied to the imaging device 21 using the bonding member, such that the occurrence of cracks or breakage of the imaging elements 10 can be reduced.

Also, the imaging device 21 may include electronic components 11. As the imaging device 21 includes electronic components 11, it is possible to mount the electronic components 11 on the insulating substrate 2 at the time of manufacturing the imaging device 21, for example.

Imaging Module Configuration

FIGS. 2A and 2B, FIGS. 3A and 3B, and FIGS. 5A and 5B illustrate an imaging module 31 that utilizes the imaging element mounting substrate 1. The imaging module 31 may include an imaging device 21, electronic components 11 mounted on a second mounting region 2b, and a lens housing 19 secured to the fixed region 2c.

In the examples illustrated in FIGS. 2A and 2B, FIGS. 3A and 3B, and FIGS. 5A and 5B, the imaging module 31 may include a lens housing 19 secured to the fixed region 2c.

By including the lens housing 19, airtightness may be further improved. The lens housing 19 may include a housing made from, for example, a resin or a metal material, and one or more concave or convex lenses comprising a resin, liquid, glass, quartz, or the like. In addition, the lens housing 19 may be provided with a drive device or the like for driving vertical and horizontal movement. The drive device may be electrically connected to the insulating substrate 2.

In addition, the lens housing 19 may include an opening in at least one side of four directions in a top view. An external circuit may be inserted through the opening of the lens housing 19 and be electrically connected to the insulating substrate 2. In addition, after the external circuit is electrically connected to the insulating substrate 2, the opening of the lens housing 19 may be sealed with a sealing material such as resin or the like, such that the inside of the imaging module 31 may be hermetically sealed.

A material for securing the lens housing 19 to the fixed region 2c may include a brazing material, for example, a thermosetting resin, solder, or the like. In addition, the material used to secure the lens housing 19 to the fixed region 2c may be electrically conductive or electrically non-conductive. When the material attached to the fixed region 2c is electrically conductive, in a configuration where a drive device for driving vertical and horizontal movement is incorporated in the lens housing 19, a power source and a signal can be brought in from the outside through the insulating substrate 2.

Figure 2A:
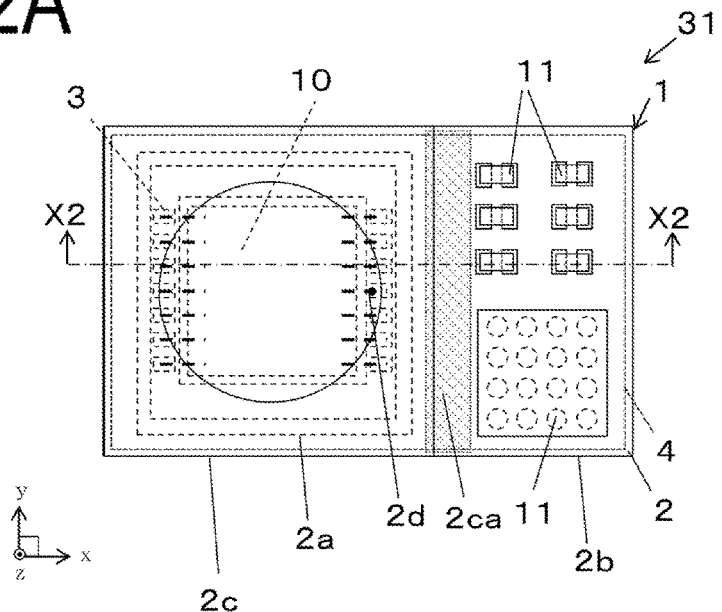
FIG. 2A is a top view illustrating the outer appearance of an imaging module according to another aspect of one embodiment of the present invention.
Figure 2B:
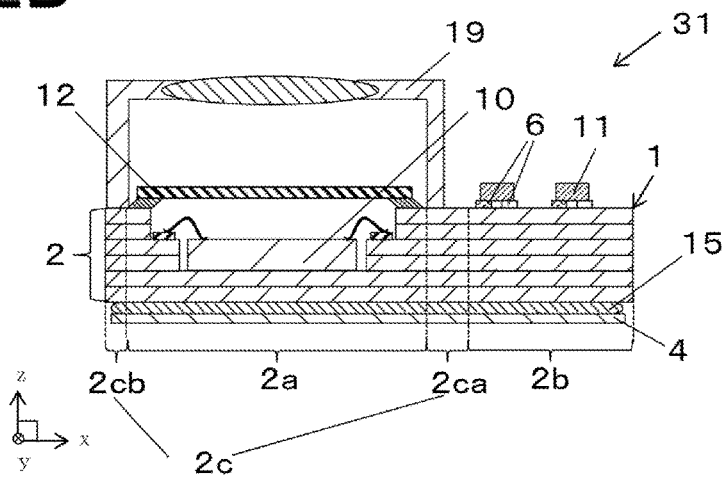
FIG. 2B is a vertical cross-sectional view corresponding to the line X2-X2 of FIG. 2A.

As in the example illustrated in FIGS. 2A and 2B, all sides of the lens housing 19 may be secured in the fixed region 2c on the top surface of the insulating substrate 2, or, as illustrated in the example of FIGS. 5A and 5B, a portion may be secured on the metal substrate 4. In the examples illustrated in FIGS. 2A and 2B and FIGS. 3A and 3B, all sides of the lens housing 19 may be secured in the fixed region 2c on the top surface of the insulating substrate 2. In this way, when the lens housing 19 is electrically connected to the insulating substrate 2, as the bonding surface area can be maximized, the electrical characteristics can be improved. In addition, as the surface of the insulating substrate 2 serves as a reference, inclination (bending, tilting) of the lens housing 19 seldom occurs. As in the example illustrated in FIGS. 5A and 5B, as a part of the lens housing 19 is secured to the metal substrate 4, stress applied from the lens housing 19 can be dispersed to the metal substrate 4. Therefore, the occurrence of cracks or breakage of the insulating substrate 2 can be reduced.

In the examples illustrated in FIGS. 2A and 2B, FIGS. 3A and 3B, and FIGS. 5A and 5B, the imaging module 31 may include electronic components 11 mounted on the second mounting region 2b. The electronic component 11 may, for example, include a passive component such as a chip capacitor, an inductor, or a resistor, or an active component such as Optical Image Stabilization (OIS), a signal processing circuit, a gyro sensor, a light emitting diode (LED) or the like. These electronic components 11 may be connected to the second pads 6 by electronic bonding members such as wire bonds, gold bumps, solder, and electrically conductive resin. Note that these electronic components 11 may be connected to the imaging elements 10 via internal wiring or the like provided in the insulating substrate 2. Also, when the electronic component 11 includes an LED, it is possible to reduce the occurrence of flares and the like by disposing the electronic component 11 outside the lens housing 19.

Manufacturing Method for the Imaging Element Mounting Substrate, Imaging Device, and Imaging Module Next, an example of a manufacturing method for the imaging element mounting substrate 1, imaging device 21, and imaging module 31 according to the present embodiment will be described. Note that the example of the manufacturing method described below is a manufacturing method that uses a multipiece wiring base plate for the insulating substrate 2.

(1) First, ceramic green sheets for configuring the insulating substrate 2 are formed. For example, in the case where an insulating substrate 2 comprises an aluminum oxide ($Al_2O_3$)-based sintered body is to be obtained, a powder such as silica ($SiO_2$), magnesia (MgO), or calcia (CaO) is added as a sintering aid to the $Al_2O_3$ powder. A suitable binder, a solvent, and a plasticizer are furthermore added, and the mixture is kneaded together into a slurry. Then, multipiece ceramic green sheets are obtained through a conventionally well known formation method, such as a doctor blade method or a calender roll method.

Note that when the insulating substrate 2 is formed from a resin, for example, the insulating substrate 2 can be formed through a method such as a transfer mold method or an injection mold method using a mold that enables the resin to be formed into a predetermined shape. In addition, the insulating substrate 2 may be formed by impregnating a base material formed of glass fibers with a resin, such as glass epoxy resin. In this case, the insulating substrate 2 can be formed by impregnating a base material formed of glass fibers with an epoxy resin precursor and thermally curing the epoxy resin precursor at a predetermined temperature.

(2) Next, using a screen printing method, a metal paste may be coated on or filled into a section of the ceramic green sheet obtained in the above-described step (1) that will become the first pad 3, the second pad 6, the third pad 9, the internal wiring, and the through conductors. This metal paste is created so as to have an appropriate viscosity by adding a suitable solvent and binder to the metal powder formed of the above-described metal materials, and kneading the mixture. Note that glass, ceramics, and the like may also be included in the metal paste in order to increase the bonding strength with the insulating substrate 2.

(3) Next, the aforementioned green sheet may be processed using a metal mold or the like. An opening may be formed in the central portion of the green sheet that will become the insulating substrate 2.

(4) Next, the ceramic green sheets that will become respective insulating layer may be stacked and compressed. Thus, the ceramic green sheet laminated body that will become the insulating substrate 2 may be fabricated.

(5) Next, the ceramic green sheet laminated body may be fired at a temperature of approximately 1500° C. to 1800° C. to obtain a multipiece wiring board on which a plurality of the insulating substrates 2 are arranged. Note that, in this step, the above-described metal paste is fired at the same time as the ceramic green sheets forming the insulating substrate 2, and forms the first pad 3, second pad 6, third pad 9, the internal wiring, and the through conductors.

(6) Next, the multipiece wiring board obtained by the firing may be divided into the plurality of insulating substrates 2. In this division, a method can be used in which split grooves are formed in the multipiece wiring board in locations that will serve as the outer edges of the insulating substrates 2, and the multipiece wiring board may then divided along those split grooves. Alternatively, a method can be used in which the multipiece wiring board is cut, by slicing and the like, along the locations that will serve as the outer edges of the insulating substrates 2. Note that the split grooves can be formed by using a slicing device to cut to a depth less than the thickness of the multipiece wiring substrate after firing. Also, the split grooves can be formed by pressing a cutter blade against the ceramic green sheet laminated body used as the multipiece wiring board, or by using a slicing device to form cuts having a depth less than the thickness of the ceramic green sheet laminated body.

(7) Next, the metal substrate 4 bonded to the bottom surface of the insulating substrate 2 may be prepared. The metal substrate 4 may be created by a punching processing method using a stamping metal mold or etching on a plate member comprising a metal material. Also, in the case where the metal substrate 4 comprises a metal material such as an Iron-Nickel-Cobalt (Fe—Ni—Co) alloy, 42 alloy, copper (Cu) or a copper alloy, a nickel plated layer and a gold plated layer may be deposited on the surface. In this way, oxidation corrosion on the surface of the metal substrate 4 may be effectively suppressed.

(8) Next, the insulating substrate 2 and the metal substrate 4 may be bonded via the bonding material 15. With respect to the bonding material 15, a paste-like thermosetting resin (bonding member) may be applied to the bonding surface of either one or both of the insulating substrate 2 and the metal substrate 4 using a screen printing method, a dispensing method, or the like. Next, after the thermosetting resin has dried, the insulating substrate 2 and the metal substrate 4 may be stacked together and passed through an atmosphere tunnel furnace, an oven, or the like. Then, the bonding material may be thermally cured by applying pressure and heating, and the insulating substrate 2 and the metal substrate 4 may be firmly bonded.

The bonding material 15 is obtained, for example, by adding a filling material comprising spherical silicon oxide and the like, a hardening agent mainly containing an acid anhydride such as tetrahydromethylphthalic anhydride, and carbon powder or the like as a coloring agent, to a main agent comprising one of a bisphenol A based liquid epoxy resin, a bisphenol F based liquid epoxy resin, a liquid phenol novolac resin, and the like, and mixing and kneading these materials using a centrifugal agitator and the like, thus obtaining a paste. Alternatively, for example, a bonding material 15 can be used that is obtained by adding one of an imidazole or amine based hardening agent, a phosphorus based hardening agent, a hydrazine based hardening agent, an imidazole adduct based hardening agent, an amine adduct based hardening agent, a cationic polymerization based hardening agent, a dicyandiamide based hardening agent and the like to one of an epoxy resin, such as a bisphenol A based epoxy resin or a modified bisphenol A based epoxy resin, a bisphenol F based epoxy resin, a phenol novolac based epoxy resin, a cresol novolac based epoxy resin, a special novolac based epoxy resin, a phenol derivative epoxy resin, a bisphenol skeleton epoxy resin and the like.

(9) Next, the imaging elements 10 may be mounted on the first mounting region 2a of the insulating substrate 2, and the imaging device 21 may be produced. The imaging elements 10 may be electrically connected to the insulating substrate 2 using wire bonding or the like. Also, at this time, an adhesive or the like may be provided on the image elements 10 or the insulating substrate 2 to affix them to the insulating substrate 2. In addition, after the electronic elements 10 are mounted on the first mounting region 2a of the insulating substrate 2, the lid 12 may be bonded with the adhesive material 14. Note that at this time, the electronic components 11 may be mounted on the second mounting region 2b of the insulating substrate 2 using solder, an electrically conductive resin, or the like.

(10) The lens housing 19 may be mounted to the fixed region 2c of the insulating substrate 2. The lens housing 19 may be bonded to the insulating substrate 2 using solder, an electrically conductive resin, an electrically non-conductive resin, or the like. Note that at this time, as well, the electronic components 11 may be mounted on the second mounting region 2b of the insulating substrate 2 using solder, an electrically conductive resin, or the like.

By assembling the insulating substrate 2, the metal substrate 4, and the lens housing 19 as described above, the imaging element mounting substrate 1, the imaging device 21, and the imaging module 31 can be manufactured. The imaging device 21 and the imaging module 31 may be obtained through the aforementioned processes (1) to (10). Note that an order of the above-described steps (1) to (10) is not prescribed.

Other Embodiments

Next, an imaging module 31 according to another embodiment of the present invention will be described with reference to FIGS. 6A and 6B. The differences between the imaging module 31 of this embodiment and the imaging module 31 of previous embodiments include the fact that the electronic components 11 may be mounted to the first mounting region 2a, and the fact that a third pad 9 is provided on the second mounting region 2b. Note that, in the example illustrated in FIGS. 6A and 6B, the third mounting region 2ca may is indicated by dots and dashed lines in a top view.

In the present embodiment, the electronic components 11 may be mounted on the first mounting region 2a of the insulating substrate 2. As described herein, the first mounting region 2a may include an area where at least one imaging element 10 is mounted, and electronic components 11 may be mounted around the imaging elements 10. As in the example illustrated in FIGS. 6A and 6B, as the electronic components 11 are mounted on the first mounting area 2a, for example, in the case where the electronic component 11 is a component susceptible to temperature change or sensitive to humidity or dust, the lens housing 19 may make it possible to protect the electronic components 11 from temperature changes, humidity, dust, or the like.

As in the example illustrated in FIGS. 6A and 6B, the third pad 9 may be provided in a second connection region 2b. As in the example illustrated in FIGS. 6A and 6B, it is possible to minimize the thickness of the imaging module 31 and the external circuit board by providing a third pad 9 on the top surface of the insulating substrate 2 in the second connection region 2b.

The third pad 9 may, for example, be a pad for electrically connecting the imaging module 31 and external devices. For example, the third pad 9 may be connected to an external circuit board such as a flexible substrate.

Next, an imaging device 31 according to another embodiment of the present invention will be described with reference to FIGS. 7A and 7B and FIGS. 8A and 8B. The difference between imaging module 31 of the present embodiment and the imaging module 31 of previous embodiments includes the fact that a plurality of imaging elements 10 are mounted.

Figure 7A:
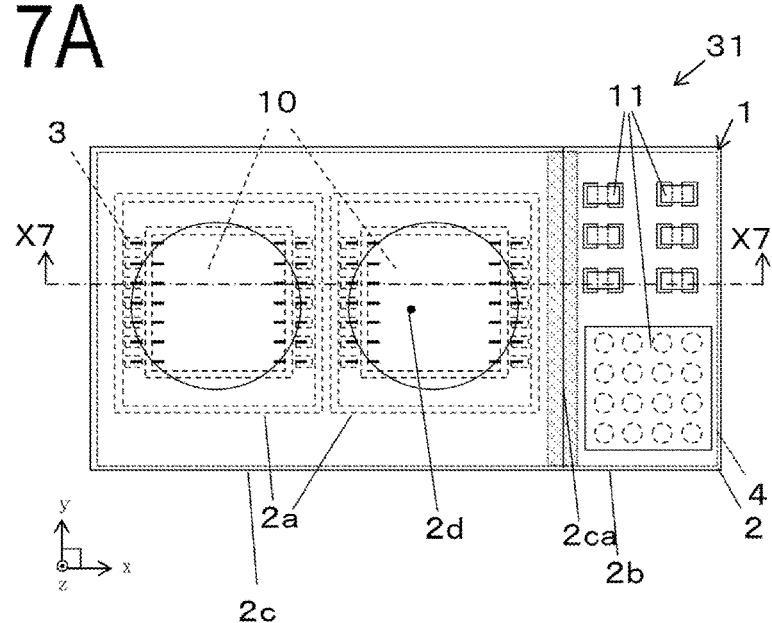
FIG. 7A is a top view illustrating the outer appearance of an imaging module according to an aspect of another embodiment of the present invention.
Figure 7B:
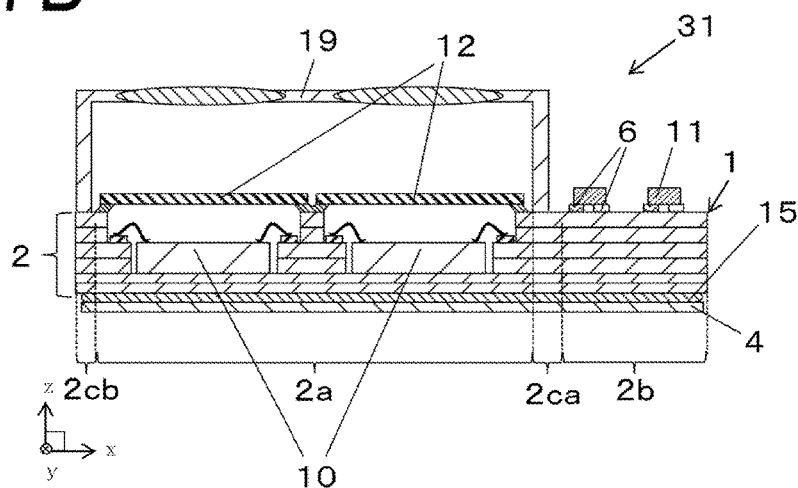
FIG. 7B is a vertical cross-sectional view corresponding to the line X7-X7 in FIG. 7A.

FIGS. 7A and 7B illustrate an imaging module 31 according to the present embodiment. Note that, in the examples illustrated in FIGS. 7A and 7B and FIGS. 8A and 8B, the third mounting region 2ca may be indicated by dots and dashed lines in a top view.

With respect to the imaging module 31 of the present embodiment, a plurality of imaging elements 10 may be mounted on the first mounting region 2a of the insulating substrate 2. By mounting a plurality of imaging elements 10 on the insulating substrate 2, it is possible to further improve the image quality of the image captured by the imaging module 31. In addition, in such a configuration, it is possible to reduce bending of the insulating substrate 2 due to stress from the lens housing 19.

In the present embodiment, as in the example illustrated in FIGS. 7A and 7B, a separate lid 12 may be provided for each of the plurality of imaging elements 10, or a single lid 12 may be provided so as to cover all of the plurality of imaging elements 10. As in the example illustrated in FIGS. 7A and 7B, by providing an individual lid 12 for each of the plurality of imaging elements 10, in configurations in which each imaging element 10 is a different type, it is possible to independently select and provide a suitable lid 12 for each imaging element 10. Alternatively, if one lid 12 is provided so as to cover all of the plurality of imaging devices 10, the manufacturing process may be simplified.

Figure 8A:
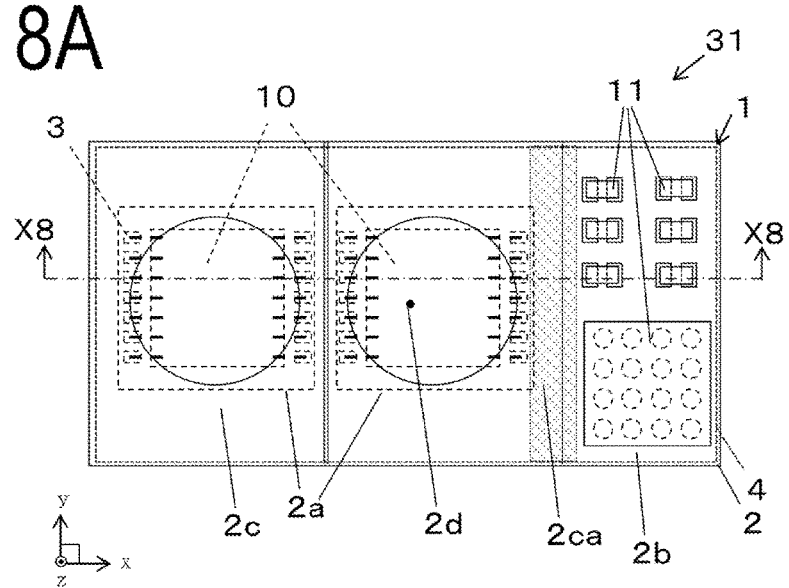
FIG. 8A is a top view illustrating the outward appearance of an imaging module according to an aspect of another embodiment of the present invention.
Figure 8B:
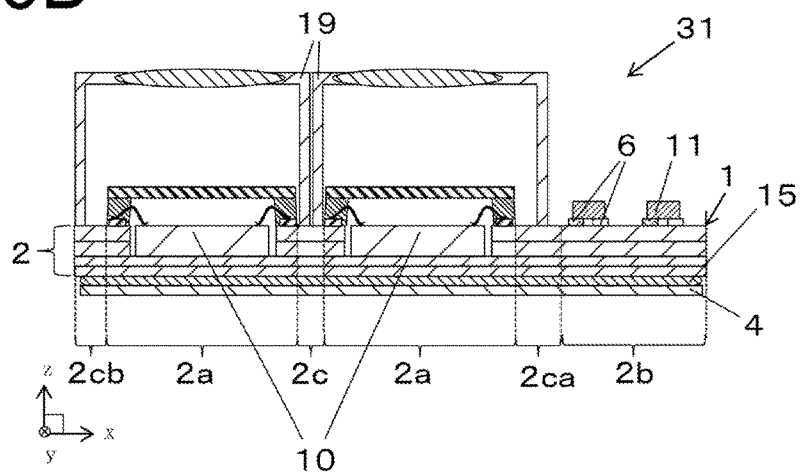
FIG. 8B is a vertical cross-sectional view corresponding to the line X8-X8 in FIG. 8A.

FIGS. 8A and 8B illustrate an imaging module 31 according to another embodiment. Note that the difference between FIGS. 7A and 7B and FIGS. 8A and 8B is the differing number of lens housings 19.

In another aspect of the present embodiment, the imaging module 31 may include a plurality of first mounting regions 2a on the insulating substrate 2, and an imaging element 10 may be mounted on each of the plurality of first mounting regions 2a. Even in such a configuration, it may be possible to reduce the bending of the insulating substrate 2 due to the stress from the lens housing 19.

In addition, when the insulating substrate 2 is provided with a plurality of first mounting regions 2a, the fixed region 2c may be provided between the first mounting regions 2a. At this time, by providing the metal substrate 4 so as to overlap with the fixed region 2c located between the first mounting regions 2a, bending of the insulating substrate 2 as a result of the stress from the lens housing 19 may be reduced with respect to the fixed region 2c between the first mounting regions 2a. Therefore, the occurrence of cracks or breakage of the imaging element mounting substrate 1 can be reduced. Accordingly, it may be possible to mitigate issues associated with difficulty operating the imaging module 31 and noise occurring in captured images.

In the examples illustrated in FIGS. 7A and 7B and FIGS. 8A and 8B, the first mounting region 2a may be provided on the bottom surface of the recessed portion of the insulating substrate 2, but configurations in which the insulating substrate 2 is a flat plate shape and the first mounting region 2a is provided on the top surface of the insulating substrate 2 are also possible.

As in the example illustrated in FIGS. 7A and 7B, the lens housing 19 may be provided so as to cover the plurality of imaging elements 10, or provided so as to cover respective imaging element 10 as in the example shown in FIGS. 8A and 8B. As in the example illustrated in FIGS. 7A and 7B, as the lens housing 19 is provided so as to cover the plurality of imaging elements 10, the manufacturing process may be simplified and the weight may be reduced as a result of decreasing the number of parts. As in the example illustrated in FIGS. 8A and 8B, the lens housing 19 may be provided so as to cover respective imaging element 10, such that, in configurations in which each imaging element 10 is a different type, it is possible to independently select and provide the lens housing 19 for each imaging element 10.

Next, an imaging device 21 according to another embodiment of the present invention will be described with reference to FIGS. 9A and 9B. The difference between the imaging module 31 of the present embodiment and the imaging device 21 of previous embodiments includes the fact that a flexible substrate 5 is further provided between the bottom surface of the insulating substrate 2 and the top surface of the metal substrate 4. Note that, in the example illustrated in FIGS. 9A and 9B, the third mounting region 2ca is indicated by dots and dashed lines in a top view.

In the present embodiment, the imaging element mounting substrate 1 may further include a flexible substrate 5 located between the top surface of the metal substrate 4 and the bottom surface of the insulating substrate 2. Also, in this configuration, the metal substrate 4 may serve as a reinforcement, and it may be possible to reduce the undulation of the insulating substrate 2.

In addition, the flexible substrate 5 generally tends to be substantially soft relative to the insulating substrate 2. Accordingly, by having a flexible substrate 5 between the metal substrate 4 and the insulating substrate 2, stress applied to the fixed region 2c from the lens housing 19 can be absorbed by the flexible substrate 5. Therefore, it is possible to reduce bending of the insulating substrate 2 due to stress form the lens housing 19.

The flexible substrate 5 may be electrically connected to the insulating substrate 2, and may serve as an external circuit electrically connected to one or more external devices. Note that at this time, a plurality of third pads 9 may be provided on the bottom surface of the insulating substrate 2.

The flexible substrate 5 may, for example, include a base film. An insulator made of a resin such as a polyimide film may comprise as a material for forming the base film. Also, the flexible substrate 5 may include a conductive layer on the top surface of the base film. The conductive layer may comprise copper, aluminum, gold, nickel, or an alloy containing at least one or more metal materials selected from these.

Also, a plating layer may be provided on the exposed surface of the conductive layer. According to this configuration, oxidation can be mitigated by protecting the exposed surface of the conductive layer. Also, according to this configuration, electrical connections may be favorably made between the insulating substrate 2 and the conductive layer. The plating layer may be formed by depositing a nickel (Ni) layer having a thickness of from 0.5 µm to 10 µm, or by sequentially depositing the nickel plating layer and a gold (Au) plating layer having a thickness of from 0.5 µm to 3 µm. Further, a tin (Sn) plating may be applied on top of the plating layer.

The flexible substrate 5 may include a cover film provided on the top surface of the conductive layer. The cover film may include a film for protecting the surface of the conductive layer, and include an adhesive made of a resin material such as polyimide film applied to one side. The cover film may be provided on the surface of the conductive layer other than the portion electrically connected to the insulating substrate 2. Note that the flexible substrate 5 and the insulating substrate 2 may be connected by an electrically conductive bonding material.

Further, both the connecting material 16 for joining the flexible substrate 5 and the metal substrate 4 and the bonding material 15 for joining the flexible substrate 5 and the insulating substrate 2 may comprise a material that is resistant to denaturing by heat applied during the mounting process of the imaging elements 10. Examples of such a bonding material 15 and a connecting material 16 may include a bisphenol A based liquid epoxy resin, polyimide resin, or the like. In such a configuration, peeling of the flexible substrate 5 and the metal substrate 4 as well as peeling of the flexible substrate 5 and the insulating substrate 2 during the mounting process of the imaging element 10 may be mitigated. In addition, the bonding material 15 and the connecting material 16 may be electrically conductive, and the flexible substrate 5 and the insulating substrate 2, or the flexible substrate 5 and the metal substrate 4 may be electrically connected. Note that the conductive bonding material 15 or the connecting material 16 may include, for example, silver epoxy, solder, anisotropic conductive resin (ACF), anisotropic conductive film (ACP), or the like.

For example, a material constituting the connecting material 16 may include a thermosetting resin, brazing material, or the like. The thermosetting resin used as a material for forming the connecting material 16 may include, for example, a bisphenol A based liquid epoxy resin and the like. Also, the brazing material used to form the connecting member 16 may include, for example, solder, lead, glass, or the like.

The connecting material 16 may be electrically conductive. The connecting material 16 may include, for example, silver epoxy, solder, anisotropic conductive resin (ACF), anisotropic conductive film (ACP), or the like. As the connecting member 16 is electrically conductive, it is possible to electrically connect the flexible substrate 5 and the metal substrate 4. For example, by setting the ground potential of the insulating substrate 2 and the metal substrate 4 to the same ground potential via a portion of the wiring of the flexible substrate 5, the metal substrate 4 can serve as a shield to protect the imaging elements 10 from external noise.

Figure 9A:
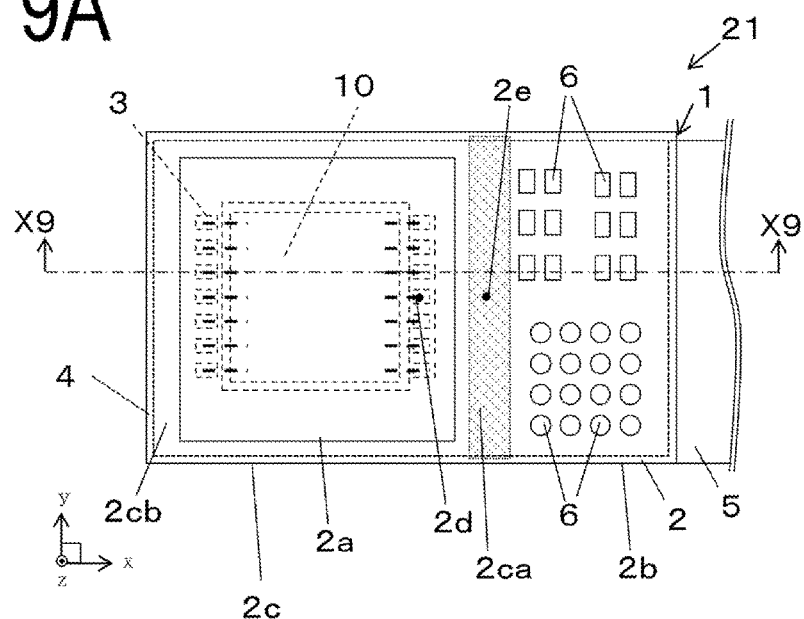
FIG. 9A is a top view illustrating the outer appearance of an imaging element mounting substrate and an imaging device according to an aspect of another embodiment of the present invention.
Figure 9B:
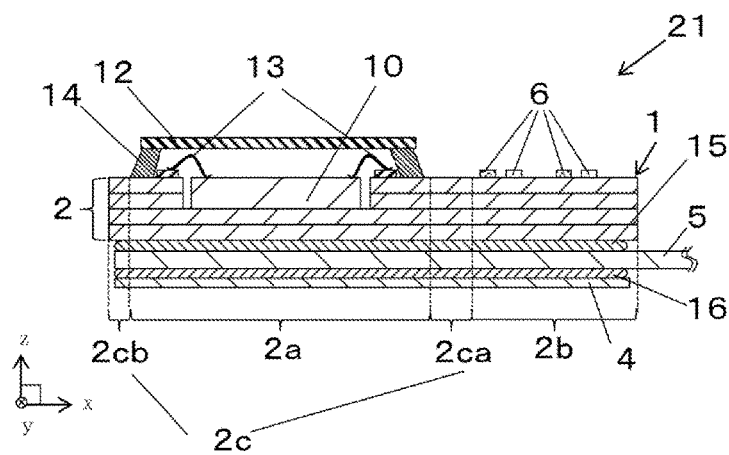
FIG. 9B is a vertical cross-sectional view corresponding to the line X9-X9 in FIG. 9A.
Figure 10A:
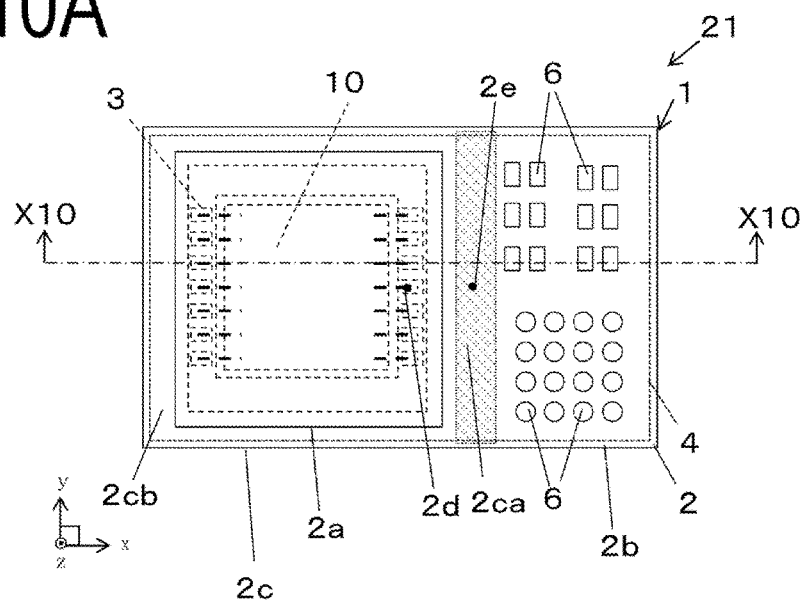
FIG. 10A is a top view illustrating an outer appearance of an imaging element mounting substrate and an imaging device according to an aspect of another embodiment of the present invention.
Figure 10B:
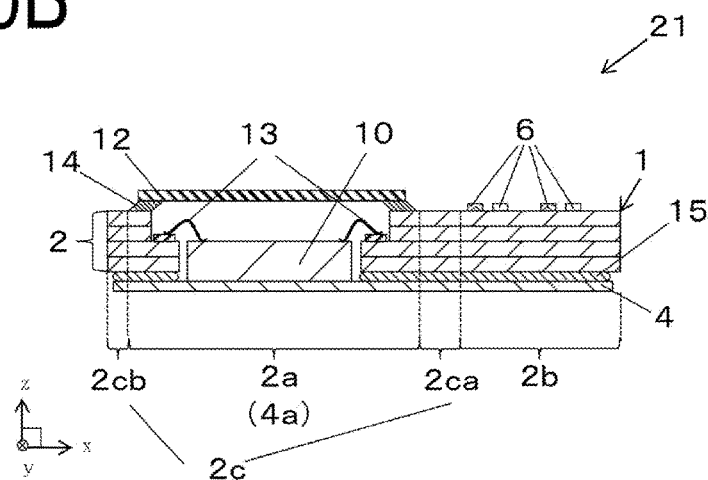
FIG. 10B is a vertical cross-sectional view corresponding to the line X10-X10 in FIG. 10A.
Figure 11A:
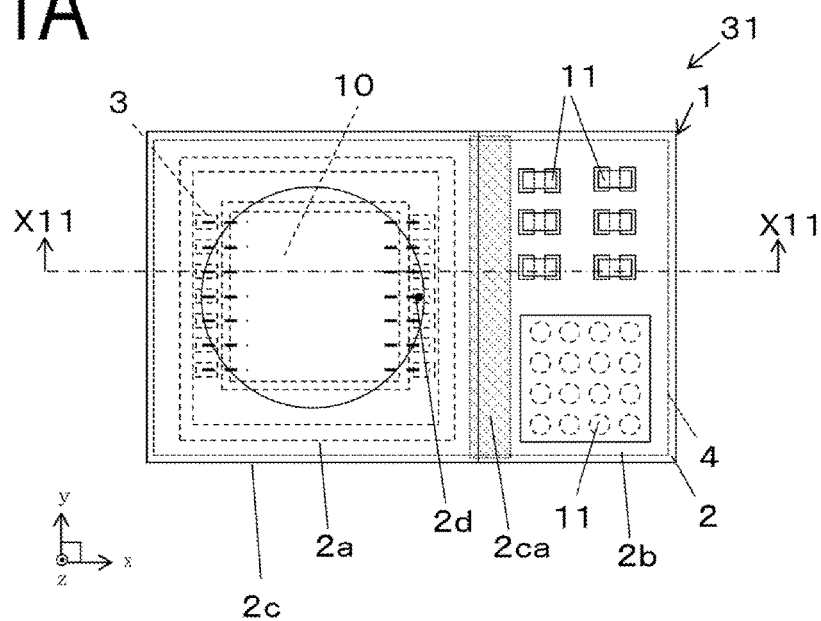
FIG. 11A is a top view illustrating an outer appearance of an imaging module according to an aspect of another embodiment of the present invention.
Figure 11B:
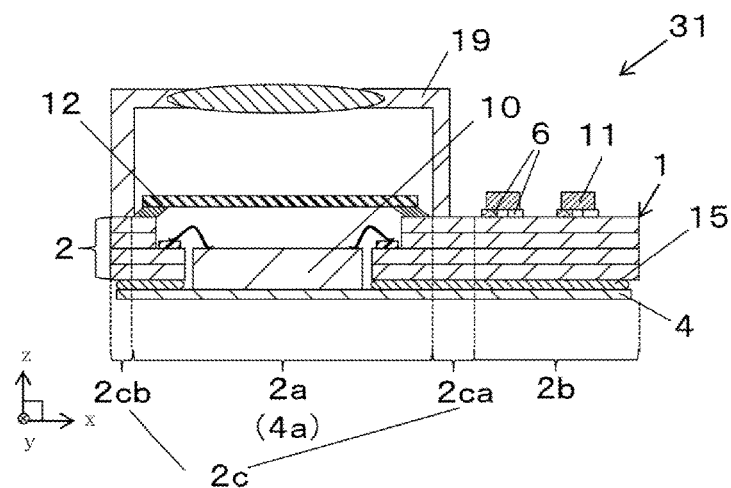
FIG. 11B is a vertical cross-sectional view corresponding to the line X11-X11 in FIG. 11A.
Figure 12A:
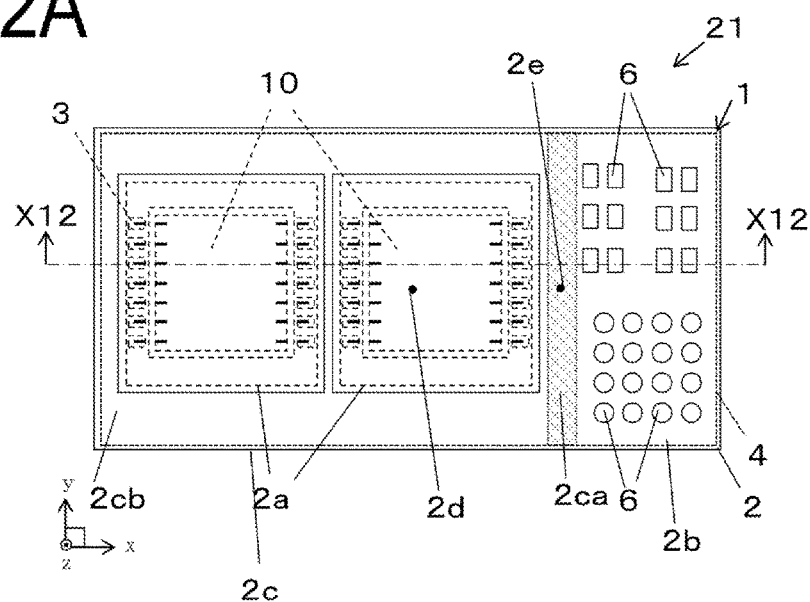
FIG. 12A is a top view illustrating the outer appearance of an imaging element mounting substrate and an imaging device according to an aspect of another embodiment of the present invention.
Figure 12B:
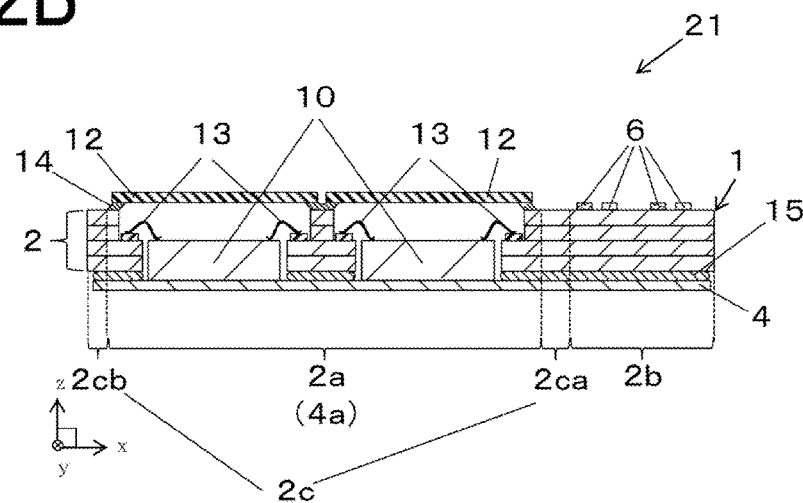
FIG. 12B is a vertical cross-sectional view corresponding to the line X12-X12 in FIG. 12A.
Figure 13A:
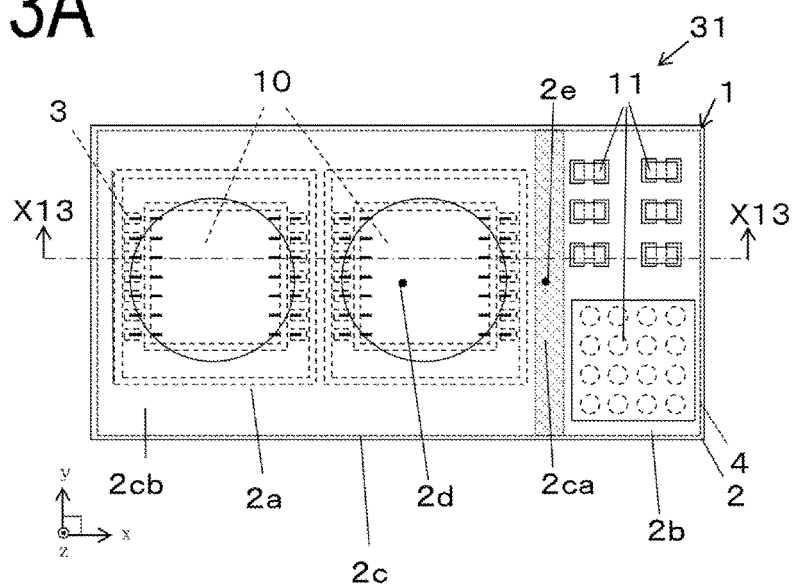
FIG. 13A is a top view illustrating the outer appearance of an imaging module according to an aspect of another embodiment of the present invention.
Figure 13B:
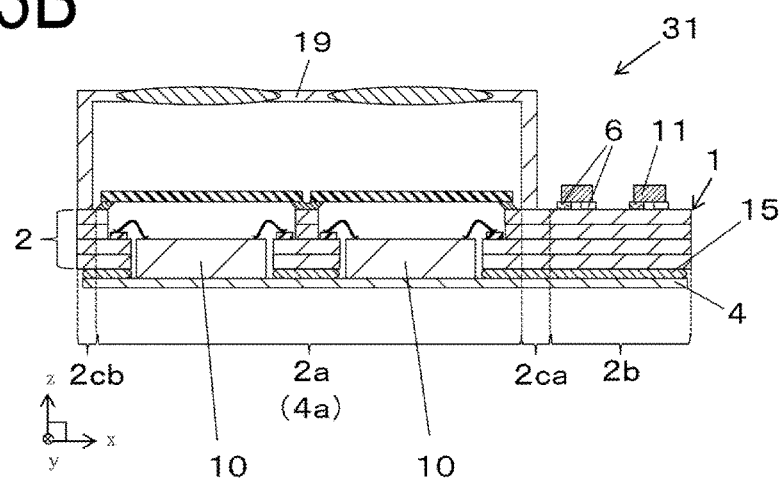
FIG. 13B is a vertical cross-sectional view corresponding to the line X13-X13 in FIG. 13A.
Figure 14A:
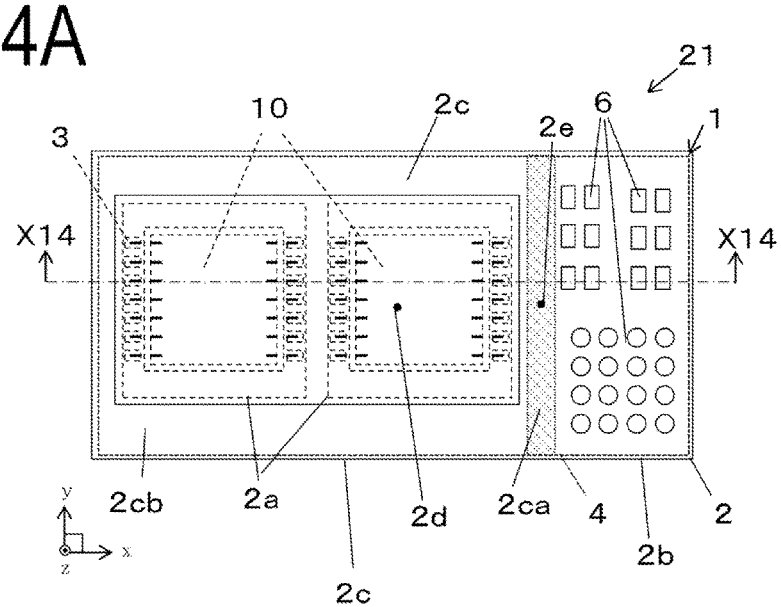
FIG. 14A is a top view illustrating the outer appearance of an imaging element mounting substrate and an imaging device according to an aspect of another embodiment of the present invention.
Figure 14B:
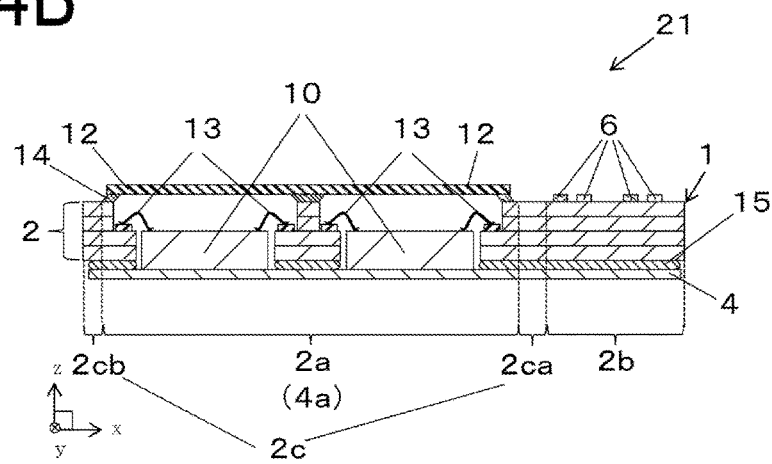
FIG. 14B is a vertical cross-sectional view corresponding to the line X14-X14 of FIG. 14A.

Also, in the example illustrated in FIGS. 9A and 9B, a portion of the outer edge of the flexible substrate 5 may be located inside the outer edge of the insulating substrate 2 in a top view. By positioning a portion of the outer edge of the flexible substrate 5 at the same position or inside of the outer edge of the insulating substrate 2, it is possible to make all the references of the outer shape of the imaging device 21 consistent with the outer edge of the insulating substrate 2.

With respect to the configuration including the flexible substrate 5 as in the example of the present embodiment, the insulating substrate 2 and the flexible substrate 5 of the present invention may be separate bodies. Accordingly, with respect to the present embodiment, the fixed region 2c may be positioned eccentrically with respect to the center of the insulating substrate 2 provided on the top surface of the flexible substrate 5. Note that, in this configuration, the flexible substrate 5 and the insulating substrate 2 may comprise the same material.

In the examples illustrated in FIGS. 10A to 15B, the third mounting region 2ca is indicated by dots and dashed lines in a top view. In the present embodiment, the imaging element mounting substrate 1 may include a metal substrate 4 and an insulating substrate 2, similar to previous embodiments. In particular, the metal substrate 4 may include a first mounting region 2a where imaging elements may be mounted on a top surface thereof. Also, the insulating substrate 2 may be bonded to the top surface of the metal substrate 4. The insulating substrate 2 may include a second mounting region 2b where electronic components 11, provided a distance away from the first mounting region 2a in a plan view, may be mounted on a top surface thereof. Further, the insulating substrate 2 may include a fixed region 2c for securing a lens positioned so as to surround the first mounting region 2a.

A third mounting region 2ca may be positioned eccentrically with respect to the center of the insulating substrate 2 in a plan view. The metal substrate 4 may be positioned so as to overlap with the third mounting region 2ca and bestride the first mounting region 2a and the second mounting region 2b. In contrast to previous embodiments, the insulating substrate 2 may be configured not as a shape having a recessed portion or a flat plate shape, but include one or more through-holes, and the first mounting region 2a may be provided on the top surface of the metal substrate 4.

FIGS. 10A and 10B and FIGS. 11A and 11B illustrate the basic configuration of this embodiment. In the examples illustrated in FIGS. 10A and 10B and FIGS. 11A and 11B, the metal substrate 4 may include a first mounting region 2a on its top surface for mounting an imaging element. Also, the insulating substrate 2 may be bonded to the top surface of the metal substrate 4. The insulating substrate 2 may include a second mounting region 2b where electronic components, provided a distance away from the first mounting region 2a in a plan view, may be mounted on a top surface thereof as well as a fixed region 2c on which a lens may be provided so as to surround the first mounting region 2a. The third mounting region 2ca may be positioned eccentrically with respect to the center of the insulating substrate 2 in a plan view. The metal substrate 4 may be positioned so as to overlap with the third mounting region 2ca and bestride the first mounting region 2a and the second mounting region 2b. That is, the differences between the example illustrated in FIGS. 10A and 10B and FIGS. 11A and 11B and previous embodiments include the fact that the insulating substrate 2 includes through-holes penetrating from the top surface to the bottom surface, and the imaging element 10 is mounted directly on the top surface of the metal substrate 4.

In the example illustrated in FIGS. 10A and 10B and FIGS. 11A and 11B, it is possible to achieve the same effect as previous embodiments. As in the examples illustrated in FIGS. 10A and 10B and FIGS. 11A and 11B, as the imaging element 10 is directly connected to the top surface of the metal substrate 4 via the through-hole in the insulating substrate 2, heat generated when the imaging device 21 operates may be dissipated directly to the metal substrate 4 which has high thermal conductivity. Therefore, it is possible to improve the heat dissipation of the imaging device 21. In addition, in the example illustrated in the first embodiment, as the insulating substrate 2 has a recessed portion or a flat plat shape, it is possible to provide internal wiring at a location overlapping with the imaging device 10 of the insulating substrate 2 in a top view. In this way, it may be possible to provide a larger internal wiring system, particularly with respect to the internal wiring connected to the power source and ground. In this way, the resistance value of the internal wiring connected to the power supply and ground may be reduced. Thus, compared to the examples illustrated in FIGS. 10A and 10B and FIGS. 11A and 11B, the electrical characteristics can be improved.

As a method for manufacturing the imaging element mounting substrate 1 as shown in FIGS. 10A and 10B and FIGS. 11A and 11B, with respect to the manufacturing method described in the first embodiment, methods in which through-holes are created in the ceramic green sheet that will become the insulating substrate 2 using a metal mold or a laser, or methods in which through-holes are collectively created by metal molds, lasers, or the like after the ceramic green sheets are laminated may be used. Note that other steps of the manufacturing method may be performed in the same manner as the manufacturing method of the first embodiment.

FIGS. 12A to 14B illustrate a configuration in which a plurality of imaging elements 10 are mounted according to another aspect of the present embodiment. In the examples illustrated in FIGS. 12A to 14B, the insulating substrate 2 may have a plurality of through-holes, and a plurality of imaging elements 10 may be mounted on the first mounting region 2a provided on the top surface of the metal substrate 4. That is, the difference between the examples illustrated in FIGS. 12A to 14B and the examples described in previous embodiments includes the fact that the insulating substrate 2 comprises a plurality of through-holes penetrating from the top surface to the bottom surface, and the plurality of imaging elements 10 are directly mounted on the top surface of the metal substrate 4.

In the examples illustrated in FIGS. 12A to 14B, it is possible to achieve the same effect as previous embodiments. In addition, similar to the description accompanying FIGS. 10A and 10B and FIGS. 11A and 11B, each of the other described embodiments and the aspects accompanying FIGS. 12A to 14B may have the above-described effects.

Figure 15A:
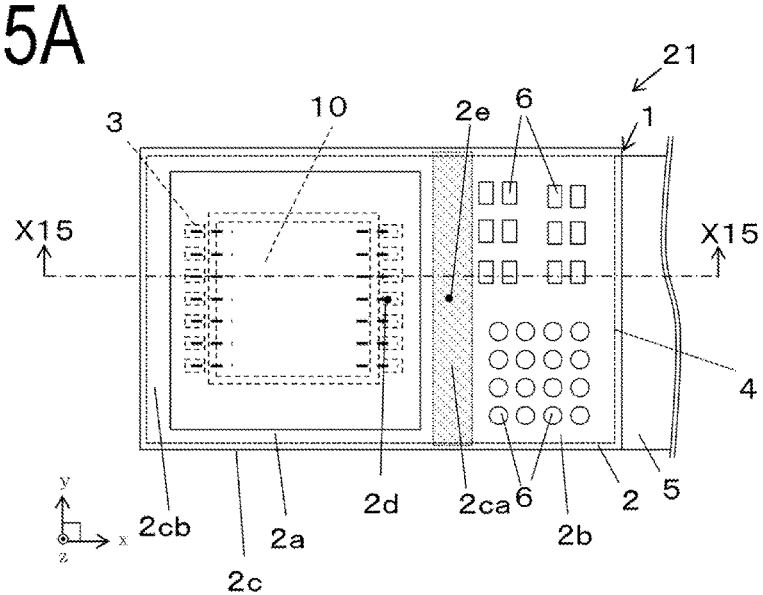
FIG. 15A is a top view illustrating the outer appearance of an imaging element mounting substrate and an imaging device according to an aspect of another embodiment of the present invention.
Figure 15B:
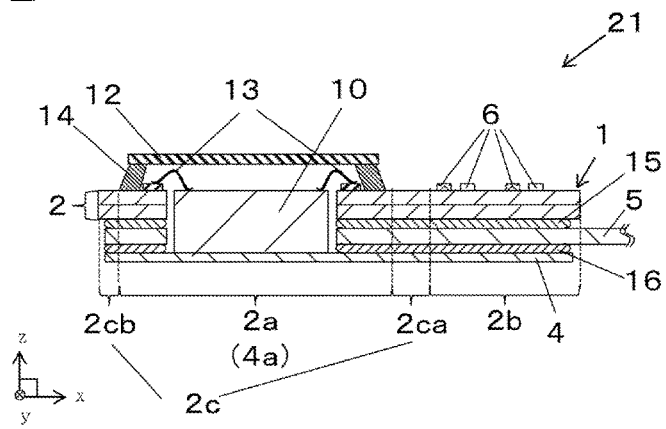
FIG. 15B is a vertical cross-sectional view corresponding to the line X15-X15 in FIG. 15A.

FIGS. 15A and 15B illustrates a configuration in which the flexible substrate 5 is provided between the insulating substrate 2 and the metal substrate 4 according to another aspect of the present embodiment. In the example illustrated in FIGS. 15A and 15B, the imaging element mounting substrate 1 may be provided between the top surface of the metal substrate 4 and the bottom surface of the insulating substrate 2, and a frame-like flexible substrate 5 surrounding a portion of the first mounting region 2a may also be provided. Note that, in the present embodiment, as the insulating substrate 2 comprises one or more through-holes, the flexible substrate 5 may be configured in a frame shape; that is, including through-holes.

The example illustrated in FIGS. 15A and 15B may achieve the same effect as the other embodiments described above. In the example illustrated in FIGS. 15A and 15B, the inner edge of the through-hole provided in the insulating substrate 2 and the inner edge of the through-hole provided in the flexible substrate 5 may be provided so as to align in a top view. However, provided that the imaging element 10 is a mountable size, the inner edge of the flexible substrate 5 may be located outside the inner edge of the insulating substrate 2 in a top view, or may be positioned on the inner side in a top view.

The present invention is not intended to be limited to the examples described in the above-described embodiments, and many variations, such as to numerical values and the like, can be made thereon. Further, the aspects described with respect to different embodiments may be freely combinable, provided that they do not conflict with one another. In addition, various combinations of characteristic portions of the above-described embodiments are not limited to the examples in the above-described embodiments. For example, the flexible substrate 5 may be provided between the metal substrate 4 and the insulating substrate 2 on which a plurality of imaging elements 10 are mounted, and other combinations are also possible.

REFERENCE SIGNS LIST

1 Imaging element mounting substrate
2 Insulating substrate
2a First mounting region
2b Second mounting region
2c Fixed region (Including areas other than the third mounting region)
2ca Third mounting region (Fixed region between the first mounting region 2a and the second mounting region 2b)
2cb Other fixed region (Excluding the third mounting region)
2d Center of the insulating substrate
2e Center of the fixed region (Between the first mounting region and the second mounting region)
3 First pad
4 Metal substrate
5 Flexible substrate
6 Second pad
9 Third pad
10 Imaging element
11 Electronic component
12 Lid
13 Bonding member
14 Adhesive material
15 Bonding material
16 Connecting material
19 Lens housing
21 Imaging device
31 Imaging module

The invention claimed is:

1. An imaging element mounting substrate comprising:
an insulating substrate comprising
a first mounting region for mounting an imaging element on a top surface of the first mounting region, and
a second mounting region for mounting electronic components located a distance away from the first mounting region,
a fixed region for securing a lens housing surrounding the first mounted region, and
a third mounting region located between the first mounting region and the second mounting region in the fixed region, the third mounting region positioned eccentrically with respect to the center of the insulating substrate in a plan view; and
a metal substrate bonded to the insulating substrate on a bottom surface of the insulating substrate,
wherein the metal substrate is located to overlap with the third mounting region and to bestride the first mounting region and the second mounting region, wherein the insulating substrate comprises a recessed portion, and
wherein a bottom surface of the recessed portion serves as the first mounting region.

2. The imaging element mounting substrate according to claim 1, wherein the metal substrate is located to overlap with the fixed region.

3. The imaging element mounting substrate according to claim 1, wherein a bonding material comprising a resin material comprises between the insulating substrate and the metal substrate.

4. The imaging element mounting substrate according to claim 1, wherein a ground layer is located on a bottom surface of the insulating substrate.

5. The imaging element mounting substrate according to claim 1, wherein a metallization layer is located on a top surface of the fixed region.

6. The imaging element mounting substrate according to claim 1, wherein, in a plan view, at least one electrode for external connections is located in the second mounting region.

7. The imaging element mounting substrate according to claim 1, further comprising a flexible substrate located between a top surface of the metal substrate and the bottom surface of the insulating substrate.

8. An imaging element mounting substrate comprising:
a metal substrate comprising a portion of a first mounting region for mounting an imaging element on a top surface of the first mounting region; and
an insulating substrate bonded to a top surface of the metal substrate, the insulating substrate comprising
a second mounting region, the second mounting region comprising a top surface for mounting electronic components located a distance away from the first mounting region in a plan view,
a fixed region for securing a lens housing surrounding the first mounting region, and
a third mounting region located between the first mounting region and the second mounting region in the fixed region, the third mounting region positioned eccentrically with respect to the center of the insulating substrate in a plan view; and
wherein the metal substrate is located to overlap with the third mounting region and to bestride the first mounting region and the second mounting region,
wherein the metal substrate has a thickness of 0.05 mm or greater thereby enabling the metal substrate to dissipate heat.

9. An imaging device comprising:
the imaging element mounting substrate according to claim 1;
an imaging element mounted on the first mounting region; and
a lid bonded to the imaging element mounting substrate and covering the imaging element.

10. An imaging module comprising:
the imaging device according to claim 9;
an electronic component mounted on the second mounting region; and
a lens housing attached to the fixed region.

* * * * *